(12) United States Patent
Schroeder et al.

(10) Patent No.: US 7,229,746 B2
(45) Date of Patent: *Jun. 12, 2007

(54) PRINTED HIGH STRENGTH PERMANENT MAGNET TARGETS FOR MAGNETIC SENSORS

(75) Inventors: Thaddeus Schroeder, Rochester Hills, MI (US); Shih-Chia Chang, Bloomfield Hills, MI (US); Lorenzo Guadalupe Rodriguez, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 323 days.

This patent is subject to a terminal disclaimer.

(21) Appl. No.: 10/405,454

(22) Filed: Apr. 2, 2003

(65) Prior Publication Data

US 2004/0196028 A1 Oct. 7, 2004

(51) Int. Cl.
*B32B 3/02* (2006.01)
*G03F 7/00* (2006.01)
*G01B 7/14* (2006.01)

(52) U.S. Cl. .................. 430/320; 430/322; 430/323; 324/207.22; 428/64.2

(58) Field of Classification Search .............. None
See application file for complete search history.

(56) References Cited

U.S. PATENT DOCUMENTS

| | | | |
|---|---|---|---|
| 3,391,455 A | 7/1968 | Hirohata et al. ............. 29/625 |
| 3,505,139 A | 4/1970 | Wentworth ................. 156/89 |
| 4,424,271 A | 1/1984 | Keel et al. ................. 430/315 |
| 4,612,502 A | 9/1986 | Spies ........................ 324/208 |
| 4,835,467 A | 5/1989 | Gokhale .................... 324/166 |
| 4,924,696 A | 5/1990 | Schroeder et al. ......... 73/118.1 |
| 5,396,389 A * | 3/1995 | Terada et al. ............. 360/123 |
| 5,580,639 A | 12/1996 | Togawa et al. ............. 428/156 |
| 5,682,670 A | 11/1997 | Bell et al. .................... 29/609 |
| 5,731,702 A | 3/1998 | Schroeder et al. ..... 324/207.21 |
| 5,754,042 A | 5/1998 | Schroeder et al. ..... 324/207.25 |
| 5,869,148 A | 2/1999 | Silverschotz et al. ....... 427/549 |
| 5,920,248 A | 7/1999 | Travostino ................. 335/302 |
| 5,955,244 A * | 9/1999 | Duval ........................ 430/314 |
| 6,163,147 A | 12/2000 | Peilloud ................ 324/207.22 |
| 6,201,466 B1 | 3/2001 | Schroeder ................ 338/32 R |
| 6,232,770 B1 | 5/2001 | Schroeder |
| 6,304,078 B1 | 10/2001 | Jarrard et al. ............. 324/207.2 |
| 6,310,473 B1 | 10/2001 | Zhao .................... 324/207.25 |
| 6,326,782 B1 | 12/2001 | Schroeder |
| 6,435,013 B1 | 8/2002 | Rodriguez et al. |
| 6,455,907 B1 | 9/2002 | Parsons et al. |
| 6,469,497 B2 | 10/2002 | Schroeder |
| 6,482,553 B1 | 11/2002 | Gottert et al. ................ 430/5 |
| 6,486,656 B1 | 11/2002 | Schroeder |
| 6,486,659 B1 | 11/2002 | Schroeder |
| 6,498,482 B2 | 12/2002 | Schroeder |
| 6,590,385 B2 | 7/2003 | Valles |
| 6,630,882 B1 | 10/2003 | Heremans et al. |
| 2003/0012948 A1 | 1/2003 | Miura et al. ............... 428/328 |
| 2004/0027846 A1* | 2/2004 | Schroeder et al. ........... 365/62 |
| 2004/0164730 A1* | 8/2004 | Schroeder et al. ..... 324/207.22 |

FOREIGN PATENT DOCUMENTS

| | | |
|---|---|---|
| DE | 19955969 | 5/2001 |
| DE | 10038296 | 2/2002 |
| GB | 909474 | 10/1962 |
| GB | 2304735 | 3/1997 |
| WO | 0187458 | 11/2001 |

\* cited by examiner

*Primary Examiner*—John A. McPherson
*Assistant Examiner*—Daborah Chacko-Davis
(74) *Attorney, Agent, or Firm*—Paul L. Marshall

(57) ABSTRACT

A process for forming magnetic target tracks for position and speed sensors. The tracks are formed from a paste comprising a magnetic powder material and a hardenable carrier. The tracks can be formed within trenches in a substrate or on the substrate surface.

2 Claims, 7 Drawing Sheets

PRINTED HIGH STRENGTH PERMANENT MAGNET TARGETS FOR MAGNETIC SENSORS

TECHNICAL FIELD

The present invention relates generally to position sensors, and more specifically to a method for forming permanent magnet targets for position sensors that provide the required degree of accuracy and resolution of the sensed position, and target apparatus formed thereby.

BACKGROUND OF THE INVENTION

Position sensors monitor the position or motion of a first mechanical component relative to a second mechanical component, by producing an electrical signal that varies as the relative position of the two components. The relative speed of the two components can also be determined by determining the time derivative of the position. Electrical position sensors are an important part of innumerable products, and are useful for determining the status of various automotive actuations and processes that involve either linear or angular displacement. For example, the position of an adjustable automobile seat can be determined by position sensing devices mounted in the movable seat frame and the fixed seat guiding rails. The position and the angular velocity of the automotive engine crankshaft can also be determined by the appropriate placement of position sensing devices.

One prior art position sensor, a contacting position sensor, requires physical contact between a signal generator and a sensing element to produce an electrical signal representative of position. Contacting position sensors typically consist of a potentiometer electrically responsive to the signal generator and mechanically responsive to the component position, such that the output electrical signals vary as a function of the component's position. Motion-induced contact wear limits the durability of the contact-type position sensors.

Non-contact magnetic type position sensors determine the position of a moving object by measuring changes in a magnetic field. Ferromagnetic material disposed on a moving object passes through a constant magnetic field, modulating the field in accordance with the object's position. A field sensing device senses the field changes from which the object's position can be determined. One example of such a magnetic sensor includes a ferromagnetic target wheel attached to and rotated by a rotating object, the speed and/or position of which is to be determined. The target wheel comprises a plurality of ferromagnetic regions separated by regions of non-magnetic material. Typically the ferromagnetic regions are disposed adjacent the target wheel periphery. The magnetic field sensor comprises a stationary biasing magnet (conventionally a permanent magnet) positioned adjacent to the wheel periphery, and a magnetic field sensing device, such as a magnetoresistor or a Hall effect device, mounted proximate the stationary magnet. The constant magnetic field produced by the stationary biasing magnet is modulated by the ferromagnetic regions of the target wheel. As the wheel rotates, the ferromagnetic regions passes adjacent the stationary magnet, changing the reluctance of the magnetic circuit and in turn varying the magnetic flux density. These variations are sensed by the magnetoresistor and manifested as variations in the resistance thereof.

Electronic circuitry responsive to the magnetoresistor produces an analog signal that varies in response to the magnetic field flux density variations. Thus a voltage signal in the form of a DC-biased waveform is produced. The waveform characteristics correspond to the shape and spacing of the ferromagnetic regions. When the signal exceeds a predetermined threshold, a ferromagnetic region of the wheel has been detected adjacent the magnetoresistor. By appropriately spacing the ferromagnetic regions on the wheel, the angular position of the shaft can be determined. The angular velocity can also be determined as the rate of change of the position. It is known that the resistance of the magnetoresistor, and thus the position accuracy of such a device, is affected by the temperature, the air gap, magnet aging and the positional accuracy of the ferromagnetic regions relative to the rotating shaft.

In lieu of ferromagnetic teeth, a single continuous shaped ferromagnetic track, with a shape designed to produce continuous variations in the magnetic field as the target moves, can be used as a position sensor. A spiral shape is one example of a continuous target track. In one exemplary embodiment the target wheel comprises a substrate and a spiral ferromagnetic track formed thereon. For the exemplary spiral track geometry, the output signal is a linear function of the rotational angle. The angular velocity can also be determined as the rate of change of the position.

A Hall effect device can be used in lieu of a magnetoresistor to sense the changing magnetic field and provide an output signal in response thereto. As is known, a Hall effect device comprises a current-carrying conductor that when placed in a magnetic field, with the magnetic field flux lines perpendicular to the direction of current flow, generates a voltage across the device that is perpendicular to both the direction of current flow and the magnetic flux lines. Thus the Hall effect voltage, which is a function of the magnetic field flux density, serves as a position indicator for the ferromagnetic target.

Whether a magnetoresistor or a Hall effect device is utilized to sense the magnetic field and thus the object position, the position sensor must be accurate, in that it must produce an electrical signal based upon the measured position. An inaccurate position sensor hinders the proper position evaluation and control of the moving component. A position sensor must also be sufficiently precise in its measurement, although the degree of precision required depends upon the specific application. For some applications, only a rough indication of position is necessary. For instance, an indication of whether a valve is substantially opened or closed may be sufficient. In other applications a precise measurement of the valve position may be required. The position sensor must also be sufficiently durable for the environment in which it is placed. For example, a position sensor used on an automotive engine valve will experience almost constant movement while the automobile is in operation. The position sensor must therefore be constructed of mechanical and electrical components that allow it to remain sufficiently accurate and precise during its projected lifetime, despite considerable mechanical vibrations and thermal extremes and gradients.

The ferromagnetic targets discussed above are typically large and heavy structures, e.g., gears and slotted disks, manufactured by machining, stamping, blanking, powder metal technology, etc. These manufacturing methods are not only expensive, but are also not suitable for manufacturing targets with fine features and complex geometries that are required for high-accuracy small target sensors. Asymmetries in the placement of the teeth in a target wheel or changes in gap distance as the target wheel rotates cause inaccuracies in position determination.

Targets with precise features are particularly needed in state-of-the-art continuous linear and angular position sensors. Such continuous sensors determine position continuously over a range of values, such as angular rotation between 0° to 120°. By comparison, the toothed wheel sensors described above provide discrete position indications when a tooth passes adjacent the field sensing element. The continuous sensors employ a single shaped target where the shape is designed to produce continuous variations in the magnetic field as the target moves relative to the sensor. A spiral shape is one example of a continuous target. Although it is possible to manufacture precise continuous sensors using the prior art techniques of machining, stamping, etc. described above, precision equipment is required and thus the cost for such sensors is high.

One technique for forming precise ferromagnetic sensor targets is described and claimed in the co-pending, commonly-owned patent application entitled, Method for Forming Ferromagnetic Targets for Position Sensors, filed on Aug. 6, 2002, and assigned application Ser. No. 10/214,047. According to this method, photolithographic techniques allow for the formation of features as small as 0.1 mm by 0.1 mm, and up to about 1 mm thick for use with either discrete target or continuous target sensors. The magnetic field variations caused by targets with these dimensions can be sensed across air gaps in the range of about 0.25 to 0.5 mm, a range that is typical for high-accuracy position and speed sensors employed in most automotive systems.

In lieu of using ferromagnetic material, permanent magnet material can be used as the target track. According to prior art techniques, the formation of permanent magnet targets can be costly and is generally limited to simple geometries formed from discrete multipole magnets or from bulk permanent magnets. These techniques are not capable of satisfying the high accuracy requirements of today's state-of-the-art position and speed sensors. However, when using a permanent magnet material the bias magnet as described above and operative in conjunction with the magnetic field sensor is not required. Thus the cost of the bias magnet is avoided and the size of the sensing assembly is reduced.

According to the teachings of the co-pending commonly owned patent application entitled Method for Forming Permanent Magnet Targets for Position Sensors, filed on Feb. 24, 2004 and assigned application Ser. No. 10/372,750, a target track of magnetic material is formed using printed circuit board processing techniques. The magnetic field sensing can be performed by a Hall effect device, a magnetoresistor, etc., from which the target position information is derived.

To form a magnetic track according to the co-pending commonly-owned application, a photoresist material layer is disposed over the copper clad layer of conventional circuit board material. The photoresist layer is patterned and etched to form one or more trenches therein. The trenches are filled with a magnetic material through an electroforming process to form the target structures. The precision of the position detection is improved by the track's straight vertical sidewalls, resulting from use of the photolithographic process.

SUMMARY OF THE INVENTION

The present invention teaches a method for manufacturing high accuracy permanent magnet targets for position and speed sensors. A trench is formed in the target substrate or in a cladding layer disposed on one surface of the substrate. A magnetic paste, comprising magnetic powder and a hardenable carrier, is formed in the trench. The target is subjected to a magnetic field for magnetizing the magnetic paste to form an accurate permanent magnet track in the target.

BRIEF DESCRIPTION OF THE DRAWINGS

The present invention will now be described, by way of example, with reference to the accompanying drawings, in which.

DESCRIPTION OF THE PREFERRED EMBODIMENT

Before describing in detail the particular method for forming targets for position and speed sensors and targets formed according to said methods in accordance with the teachings of the present invention, it should be observed that the present invention resides primarily in a novel and non-obvious combination of hardware elements and process steps related to forming said targets. Accordingly, the hardware elements and method steps have been represented by conventional elements in the specification and the drawings, showing only those specific details that are pertinent to the present invention, so as not to obscure the disclosure with structural details that will be readily apparent to those skilled in the art having the benefit of the description herein.

State-of-the-art position and speed sensors providing the required accuracy and resolution of the target position can be formed according to the present invention. Each target geometry can be designed for the intended application and is formed with a sufficient quantity of magnetic material for sensing by conventional magnetic sensing devices, taking into consideration the air gap dimensions in use in many automotive and industrial applications.

Figure 1:
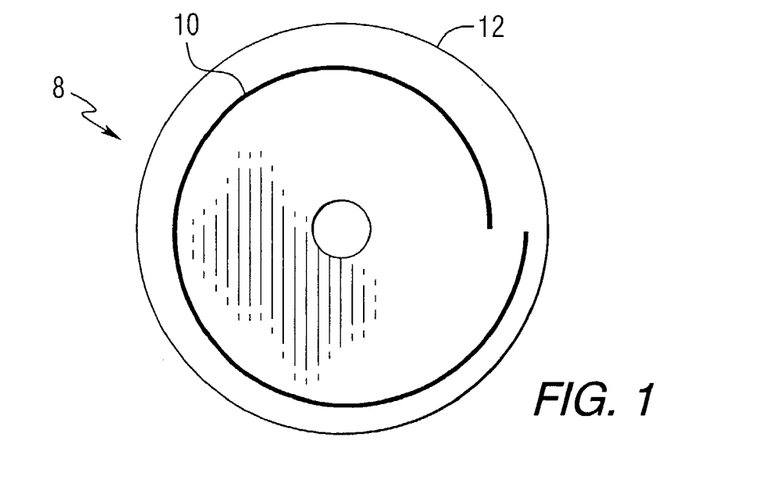
FIG. 1 illustrates a target for a position sensor constructed according to the teachings of the present invention.

FIG. 1 illustrates a target 8 comprising a continuous magnetic target track 10 formed of a magnetic material on a copper-clad substrate material 12. In one embodiment, the completed assembly is coated with a passivation layer to protect the target track 10 from degradation caused by environmental effects. When such a magnetic target track is formed according to the teachings of the present invention, the accuracy and precision obtained is better than that available using the prior art methods.

Figure 2A:
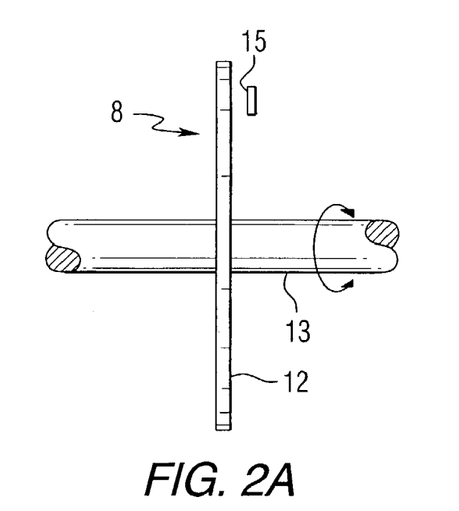
FIGS. 2A and 2B illustrate an application of the target of FIG. 1.
Figure 2B:
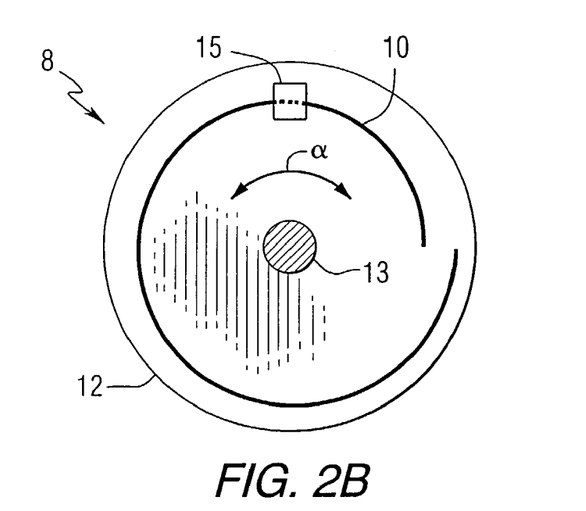
Figure 3:
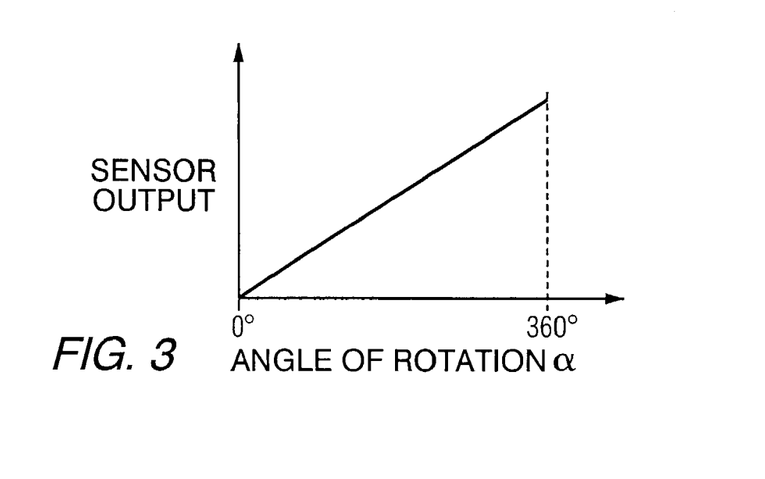
FIG. 3 illustrates the position sensor output for the target of FIGS. 2A and 2B.

An application of the target 8 for determining the angular position of a rotating shaft 13 to which the target 8 is attached, is illustrated in FIGS. 2A and 2B. In particular, these Figures indicate an angular sensor that employs a spiral magnetic target track 10 to generate an output signal proportional to the angle of rotation α, as illustrated in FIG. 3. A magnetic field sensor 15, such as a Hall effect device or a magnetoresistor, is mounted adjacent the target 8 for sensing the magnetic field of the spiral magnetic target track 10.

By way of example, as shown in FIG. 3, the spiral magnetic target track 14 provides an output that is a linear function of the angle of rotation α. In another embodiment, the output value can be obtained from a microprocessor-controlled lookup table, where the index into the table is the angular position. Because precision targets can be formed according to the teachings of the present invention, in yet another embodiment the look-up table and the microprocessor are unnecessary, as the desired relationship between the target track position and the sensor output value can be provided directly by the magnetic field sensor 15 by appropriate design of the shape and dimensions of the target track 10.

Figure 4A:
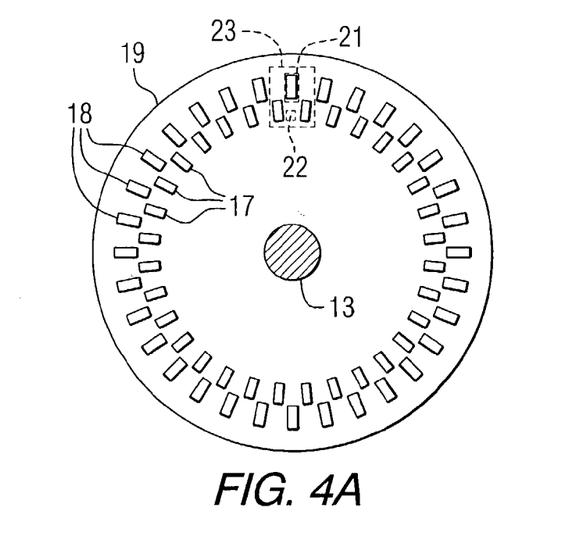
FIGS. 4A and 4B illustrate another embodiment of a target.
Figure 4B:
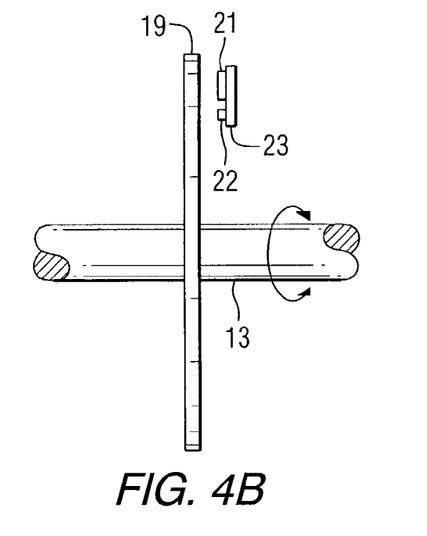
Figure 5:
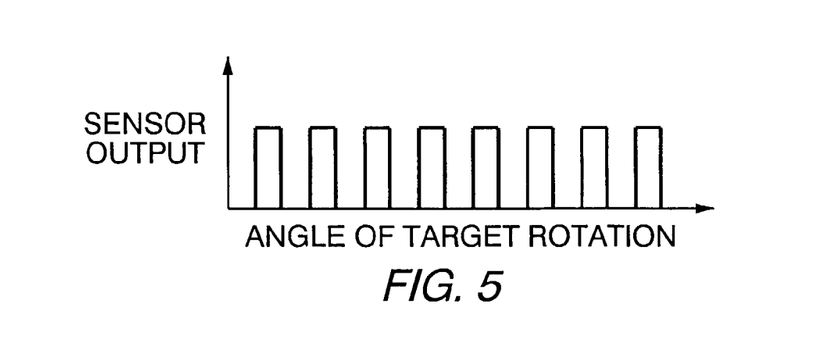
FIG. 5 illustrates the position sensor output for the target of FIG. 4.

FIGS. 4A and 4B illustrate another embodiment of a position sensor to which the teachings of the present invention can be applied. In FIG. 4A, planar complementary magnetic targets 17 and 18 are mounted on a target disk 19. The magnetic field produced by the targets 17 and 18 is sensed by magnetic field sensors 21 and 22, respectively, mounted on a substrate 23. See the side view of FIG. 4B. Due to the discrete configuration of the targets 17 and 18, and the differential operational mode of the sensors 21 and 22, the output signal as a function of target rotation is a series of precisely located pulses unaffected by air gap variations. See FIG. 5.

FIGS. 6 through 10 illustrate the process steps according to the present invention for forming magnetic targets of magnetically hard material such as the spiral magnetic target track 10 and the complementary magnetic target tracks 17 and 18 described above. Magnetically hard materials exhibit a high intrinsic coercivity ($H_{ci}$, the property of a material determined by the value of the coercive force when the material has been magnetized to saturation, where the coercive force is the opposing magnetic field intensity that must be applied to the magnetized material to remove the residual magnetism). A very strong magnetizing force must be supplied to the magnetically hard material to align the domains and create a permanent magnet. However, once the domains have been aligned, the magnetically hard material becomes a permanent magnet and retains its magnetic character with ambient temperature and conditions having little or no disrupting effects on the magnet's properties.

Figure 6:
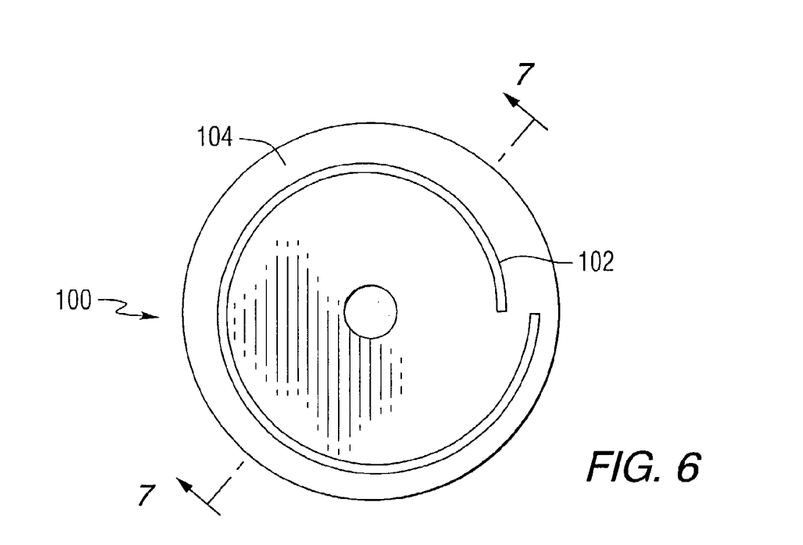
FIGS. 6 through 11 are cross-sectional views illustrating the processing steps for manufacturing a target, such as the target of FIG. 1, according to the teachings of a first embodiment of the present invention.

The process of the present invention is described in conjunction with an exemplary target 100 of FIG. 6. The target 100 includes a magnetic target track 102 formed on a substrate 104. Although the magnetic track is shown in the shape of a spiral, this shape is merely exemplary as the process is more generally applicable to any magnetic target size or shape. The cross-sectional views of FIGS. 7 through 10 are take along the plane 7-7 of FIG. 6.

Figure 7:
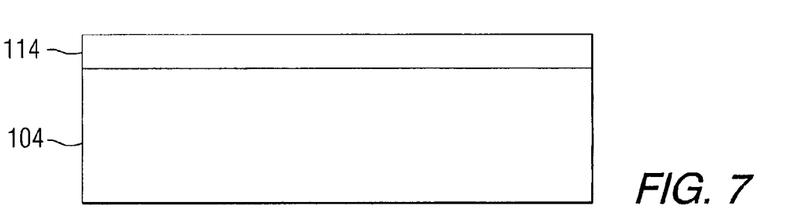

Referring to FIG. 7, in one embodiment the substrate 104 comprises a polymer or a ceramic material. According to the teachings of the present invention, a photoresist layer 114, preferably of photoresist material SU-8 available from MicroChem Corporation of Newton, Mass., is applied over the substrate 104. See FIG. 7. The SU-8 photoresist has a relatively high mechanical strength in the cross-linked state, i.e., after exposure to the ultraviolet light, and can be applied in a sufficiently thick layer to allow the formation of high-aspect ratio targets (i.e., targets that are relatively thick compared to their width dimension). Other photoresist materials displaying similar properties are suitable substitutes for SU-8 in the process of the present invention.

Figure 8:
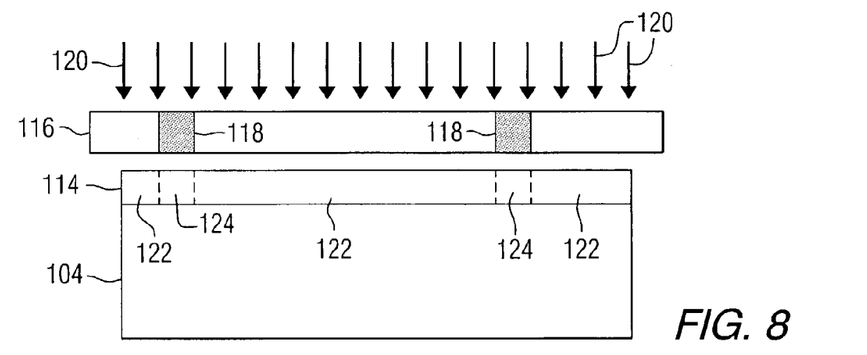

Turing to FIG. 8, a mask 116 is then introduced over the substrate 104 and the photoresist layer 114, where the mask includes regions of varying opacity that define the desired target shape. Since the SU-8 photoresist material is a negative-acting photoresist, a trench to be formed within the photoresist layer 114 according to the present invention, is defined by opaque regions 118 in the mask 116. As can be seen from the top view of FIG. 6, the magnetic target track 102 is a continuous structure. Thus the cross-sectional views of FIGS. 7 through 10 show two spaced apart regions that represent two segments of the magnetic target track 102, which will be formed according to subsequent processing steps.

The substrate 104 is exposed to ultraviolet light through the mask 116, as indicated by the arrowheads 120 in FIG. 8. After exposure, the photoresist layer is defined by certain exposed regions 122 exposed to the ultraviolet light passing through mask 116, and certain unexposed regions 124 blocked from ultraviolet light by the opaque regions 118. The exposed regions 122 are transformed from a relatively soluble state to a relatively insoluble state by the polymerization process caused by ultraviolet light. The unexposed regions 124 remain relatively soluble.

In another embodiment, where a positive-acting photoresist material is used, the target regions (i.e., where the trenches are to be subsequently formed) is defined by a transparent region in the mask and the remainder of the mask is opaque.

Figure 9:
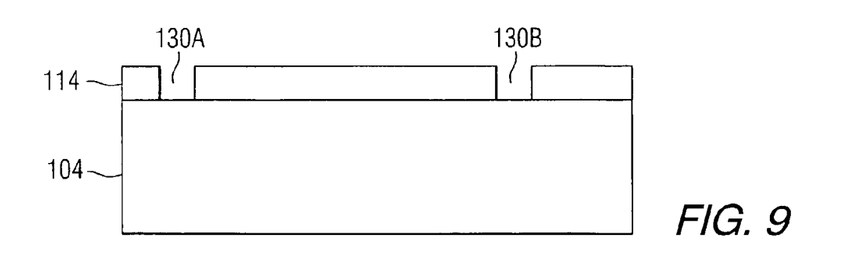

A chemical developing material, such as xylene, is then applied to the substrate 104 and the photoresist layer 114 to remove the soluble unexposed regions 124, thereby forming a trench 130, comprising segments 130A and 130B in the photoresist layer 114, as shown in the cross-sectional view of FIG. 9, according to the spiral magnetic track 102 shown in FIG. 6. It is known that any number and size trenches can be formed as dictated by the specific geometry of the target track configurations, such as the target tracks illustrated in FIGS. 1, 2B, 4A and 6.

Figure 10:
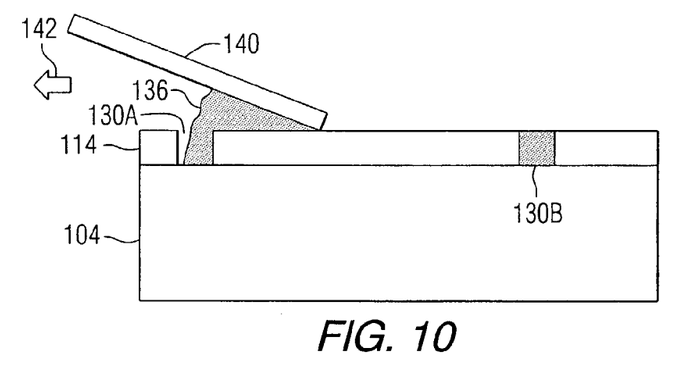

In one embodiment the trench 130 is filled according to a squeeging process as shown in FIG. 10. A magnetic paste 136, comprising magnetic particles and a bonding agent or carrier, is drawn across the upper surface of the photoresist layer 114 by a squeegee 140. The direction of movement of the squeegee 140 is indicated by an arrowhead 142. In one embodiment, the magnetic particles comprises 50% of the magnetic paste, measured by volume. In other embodiments, the magnetic particles can comprise more or less than 50%, with the value dependent on the required magnetic filed intensity for the application. The trench segment 130B is shown as filled with the magnetic paste 136, while the trench segment 130A is in the process of being filled. Once the entire upper surface of the photoresist layer 114 has been squeeged, formation of the magnetic target track 102 of FIG. 6 is complete.

In one embodiment, the magnetic paste 136 comprises a MagneQuench (MQ) powder referred to as MQP-S-9-8 available from MagneQuench, Inc. of Anderson, Ind., mixed with a hardenable fluid or paste carrier, e.g., epoxy. The constituent elements of this MQ powder include: neodymium, praseodymium, zirconium, titanium and boron. The powder particles are generally spherical with a mean diameter of approximately 40 microns and a maximum diameter of about 100 microns. Advantageously, the shape and size of these MQ powder particles improves the dimensional accuracy of bonded permanent magnets formed therefrom, and thus is particularly suited to the present invention where the accuracy of the magnetic track dimensions and position is important.

The MQP-S-9-8 powder exhibits the following magnetic properties: a residual induction ($B_r$) of about 7 kGauss, an intrinsic coercivity ($H_{ci}$) of about 9 kOersteds, and a maximum BH or energy product of about 9 MGOe.

The relatively small size and spherical shape of the MQ powder particles enables the formation of accurate and high-strength permanent magnet target tracks, such as according to the squeegeing process described above. A wide variety of magnetic sensors, including both linear and incremental sensors can be formed according to the processes of the present invention.

Figure 11:
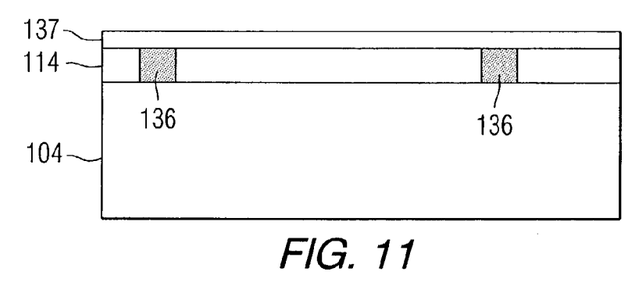

After the trench 130 is filled, the magnetic paste 136 forming the target track 102 is hardened by the appropriate technique, including, for example, temperature elevation, application of ultra-violet light or room temperature cure. The resulting structure is shown in FIG. 11.

The described MQ powder exhibits increased corrosion resistance due to the chemical composition of the powder and the smaller surface-to-volume ratio of the spherical particles. However, in certain embodiments, to prevent corrosion and environmental degradation of the track 102 a protective passivation layer 137 in FIG. 11 is formed over the substrate 104 and the photoresist layer 114. Suitable material for the passivation layer includes a polymeric material.

High-energy magnetic powders (formed for example of neodymium and samarium) generally in the shape of flakes with a median size range from approximately 180 to 400 microns are also available, but in certain embodiments these may not provide the dimensional accuracy required in certain target track applications.

After curing, the magnetic paste 136 forming the track 102 is magnetized by the application of a strong magnetizing force. The magnetic paste 136 can be magnetized either parallel or perpendicular to the plane of the substrate 104, depending on the type and orientation of the magnetic field sensor that will be employed with the target 100.

By forming the magnetic target track 102 within the photoresist trench 130 as described above, mechanical strength and support for the target track is provided by the sidewalls of the cured photoresist layer 114. This is especially important for narrow target tracks and those having a high aspect ratio, i.e., depth with respect to width.

In another embodiment, depending on the viscosity of the magnetic paste 136, a syringe can be used to deposit the magnetic paste 136 into the trench 130.

In yet another embodiment, a non-magnetic etchable cladding layer overlays the substrate 104. Thus in lieu of forming a photoresist layer 114 on the upper surface of the substrate 104, the cladding is etched to form the trench 130 and the magnetic paste 136 is formed therein. Suitable candidates for the cladding layer comprise copper, zinc or an etchable polymer.

The embodiments described above teach the formation of the trenches according to an etching process. However, the invention can also be practiced by machining a substrate material (for example by milling or by laser removal of the material) to form the trenches, or the trenches can be formed integral with the substrate material by a stamping process. Also, a stencil-like layer carrying the trenches can be permanently attached to the substrate and the magnetic paste formed within the trenches. The stencil remains attached to the substrate after formation of the target track 102, and therefore provides lateral support for the target track. In yet another embodiment, the target substrate is formed with integral trenches by using a molding process.

Figure 12:
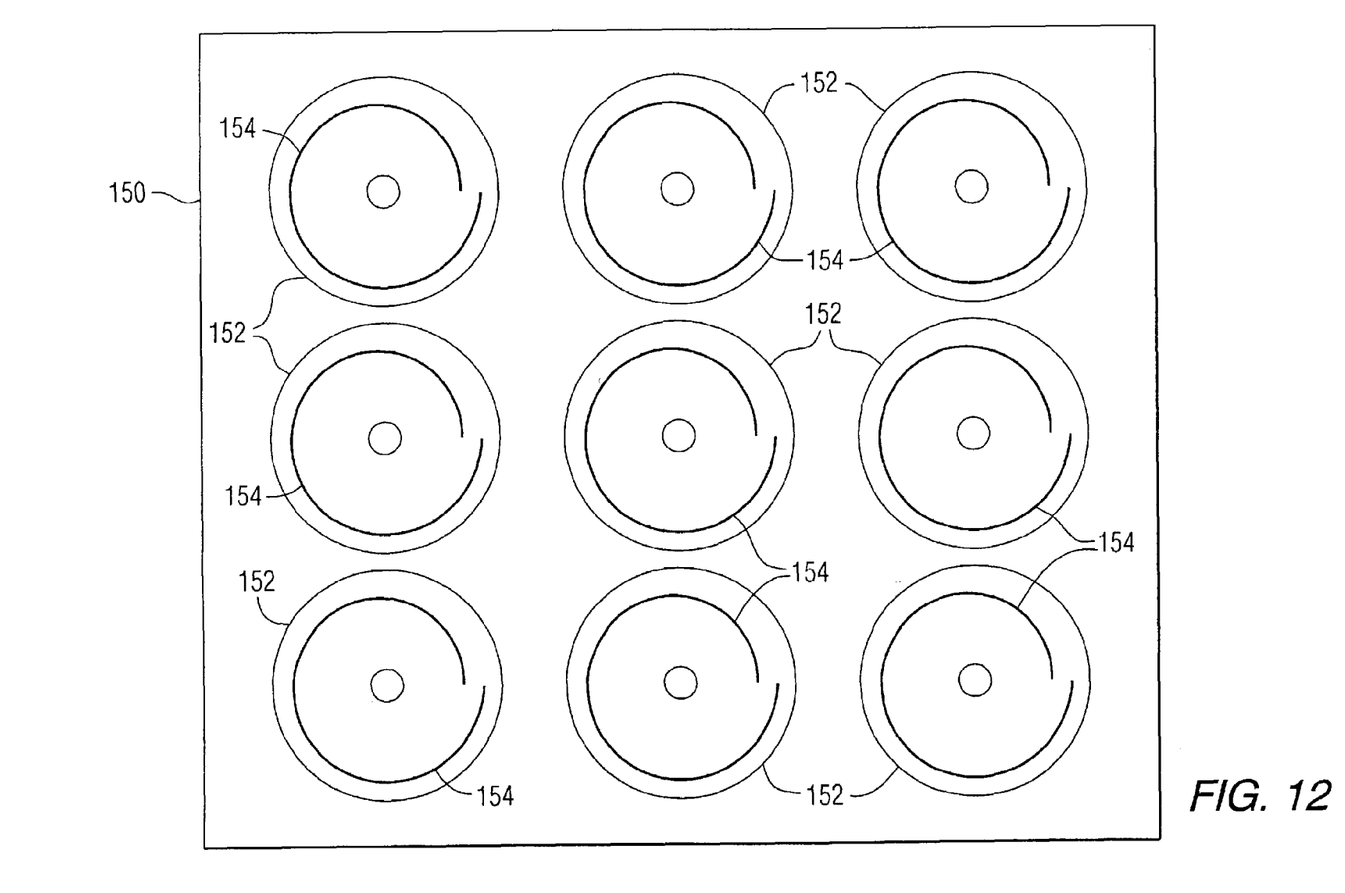
FIG. 12 illustrates a plurality of targets fabricated according to the processing steps of FIGS. 6 through 11.
Figure 13:
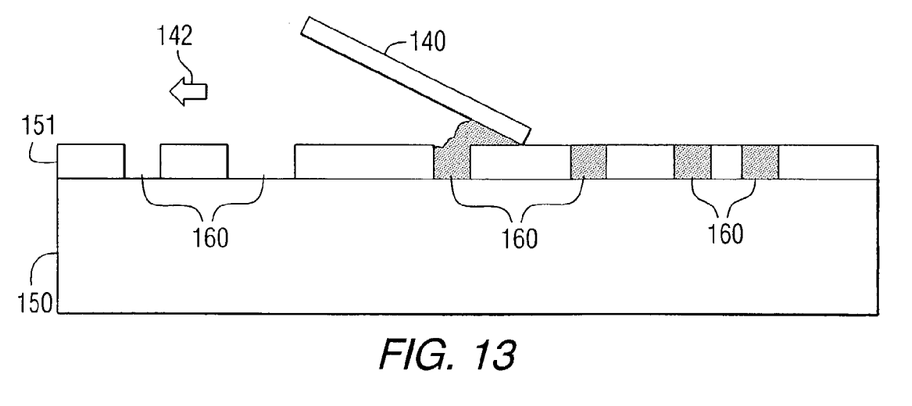
FIG. 13 is a cross-sectional view illustrating a processing step for the targets of FIG. 12.

Although the process according to the present invention has been explained above in conjunction with the fabrication of a single target, in one embodiment to improve the efficiency of the fabrication process, a plurality of such targets can be formed simultaneously on a single sheet of substrate material FIG. 12 illustrates a substrate 150 on which are formed a plurality of targets 152. Although each of the targets 152 is illustrated as having a spiral magnetic target track 154, this is merely exemplary, as any size and shape target can be formed according to the present invention. Each of the plurality of targets 152 and the target tracks 154 can be formed according to the steps set forth in conjunction with FIGS. 7 through 11. FIG. 13 illustrates a cross-sectional view of the substrate 150, the overlaying photoresist layer 151 and a plurality of trenches 160, in various stages of the filling process. The plurality of trenches 160 correspond to the target tracks 154. After formation of the target tracks 154, a passivation layer (not shown in FIG. 12 or 13) is formed thereover and the individual targets 152 are singulated.

Figure 14A:
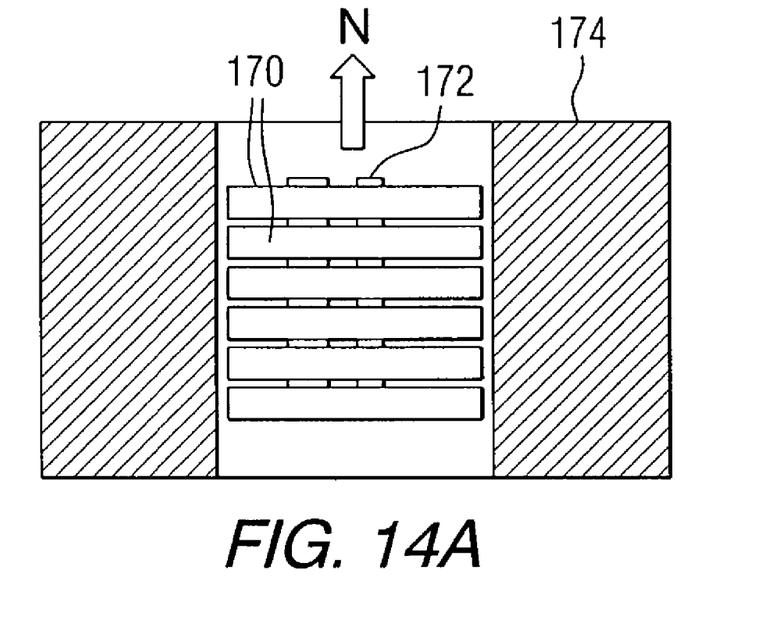
FIGS. 14A and 14B illustrate a process for magnetizing a track in a target formed according to the teachings of the present invention.
Figure 14B:
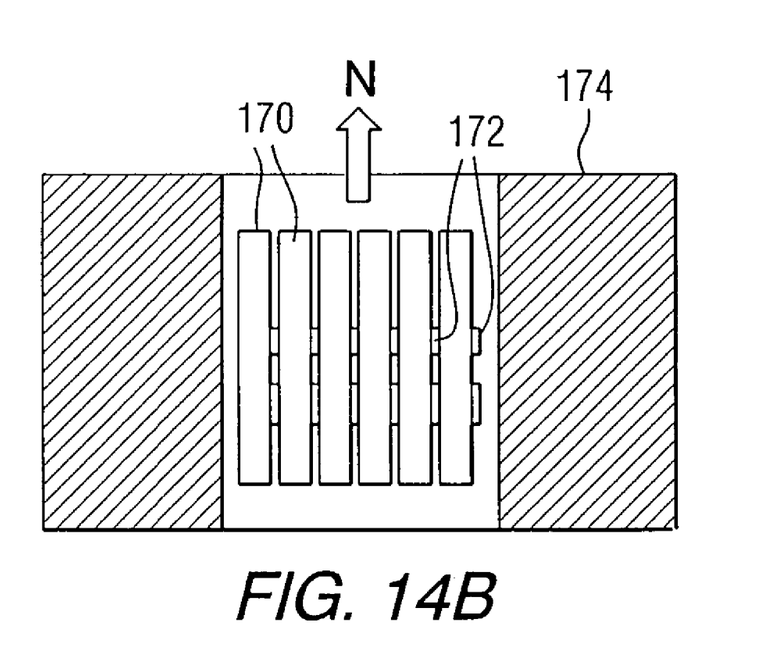

A process for magnetizing a plurality of targets is illustrated in FIGS. 14A and 14B. A stack of singulated targets 170, each having a magnetic track 172 formed thereon, is located within a central opening of a magnetizer coil 174. The "North" direction of the magnetic filed created by the magnetizer coil 174 is indicated. In FIG. 14A the targets 170 are oriented horizontally such that the magnetic tracks 172 are magnetized perpendicular to the plane of the targets 170. In FIG. 14B the targets 170 are oriented vertically such that the magnetic tracks 172 are magnetized parallel to the target plane, also referred to as in-plane magnetization. The desired direction of magnetization for the magnetic tracks 172 is determined by the relative orientation of the magnetic tracks and the magnetic sensor with which they will be employed. If a more complex magnetization orientation is desired for a position sensor application (e.g., in-plane and radial), custom-shaped magnetizers, instead of the simple coils illustrated in FIGS. 14A and 14B, would be used. The details of such magnetization orientations are known to those skilled in the art.

In yet another embodiment of the present invention, trenches are not required, as a magnetic paste trace 180 is deposited directly on the upper surface of a substrate 182. See FIG. 15. The application method employed depends on the viscosity of the magnetic paste. A standard screen printing process employing a reusable screen can be used to print features, such as the magnetic paste trace 180, as small as three times the diameter of the largest particle in the paste. As described above, the MQ powder comprises particles generally smaller than about 100 microns, so that a magnetic paste trace of about 300 microns wide can be formed.

Figure 15:
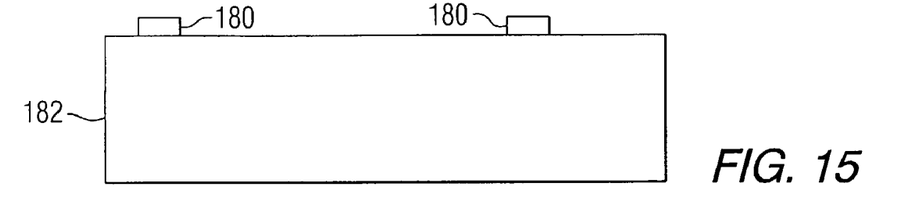
FIGS. 15 through 19 illustrate the processing steps for manufacturing a target according to a second embodiment of the present invention.

In another embodiment a stencil is disposed over the upper surface of the substrate 182, a squeegee or spray gun is then used to apply the magnetic paste to form the magnetic trace paste 180. Typically, the stencil process can be used to print features having a width of about five times the size of the largest particle, or in this case about 500 microns wide.

In yet another embodiment, a computer-controlled dispensing nozzle or syringe can deposit a magnetic track directly on the upper surface, without the use of stencils or screens. Offset printing technologies can also be used to print the magnetic trace onto the substrate upper surface.

Figure 16:
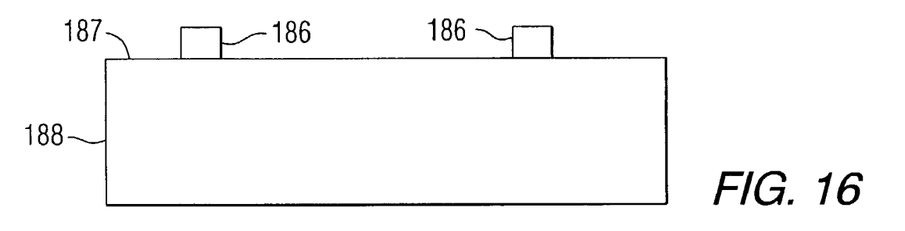

In still another embodiment, the magnetic paste is first formed into a thin sheet of bonded magnetic material. A target 186 of the desired shape is cut from the sheet and bonded to an upper surface 187 of a substrate 188, and then magnetized according to known techniques. The resulting structure is depicted in FIG. 16.

Figure 17:
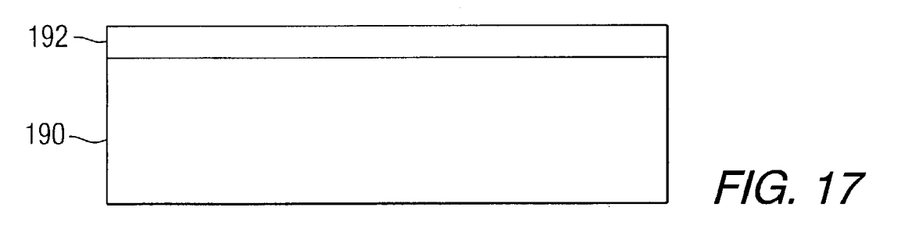
Figure 18:
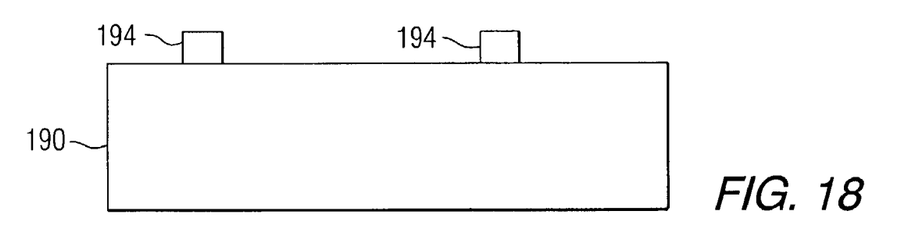
Figure 19:
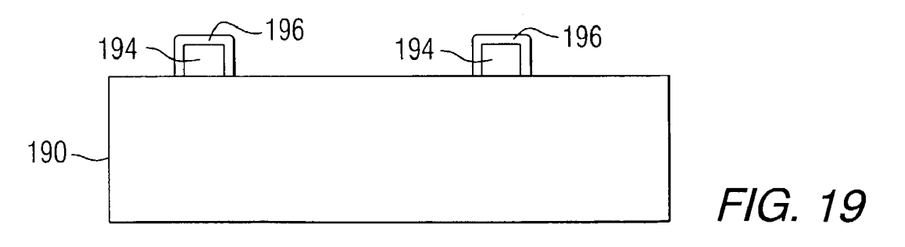

According to another process of the present invention, a substrate 190 includes a conductive cladding material 192 as shown in FIG. 17. Using known photolithographic masking, patterning and etching techniques, especially those conventionally used to form patterned printed circuit board traces, the conductive cladding material 192 is etched to form traces 194 as shown in FIG. 18. The traces 194 are then electrically charged or grounded to attract an electrically charged spray, including magnetic particles, that is directed toward the traces 194. The spray is cured using known techniques, forming the magnetic material 196 over the traces 194. See FIG. 19.

An MQ magnetic powder (such as MQP-S-9-8) in dry form can also be applied to the surface of a target substrate according to the following variations of the present invention. A hardenable adhesive, such as an epoxy, is first deposited on the substrate in those areas where it is desired to form the target tracks. The adhesive can be deposited through a mask, stencil or silk screen. The dry powder is then applied using a dusting technique and is captured by the adhesive as the adhesive hardens. Since the dry powder adheres only to those areas where adhesive is present, the free powder can be recovered for reuse.

In another embodiment, kinetic spray technology is used with magnetic-coated particles to bond the powder particles to the upper surface of the substrate and to bond the particles to each other. The material is applied through a mask overlying the upper surface of the substrate and defining the location of the magnetic target track.

The magnetic targets can also be created by a two-step molding process. First the pattern of the magnetic track is molded using the MQ magnetic powder as a base material in an injection molding process. Then the target is molded with the magnetic track serving as an insert during the second molding step. According to this method, the magnetic track can be placed anywhere and at any depth in the target material to provide the desired magnetic field, and the target shape can take on complex three-dimensional forms, as limited only by the limitations of the injection molding process.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from the essential scope thereof. For example, differently sized and shaped targets than those illustrated can be formed according to the teachings of the present invention. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming a magnetic track for a position sensor on a target substrate, comprising:

forming a material layer on a surface of the substrate wherein the material layer comprises a photoresist:

forming a trench in the material layer wherein the step of forming the trench further comprises:

positioning a mask over the photoresist layer, wherein the mask includes one or more relatively transparent regions and one or more relatively opaque regions;

exposing the mask to electromagnetic radiation, causing the regions of the photoresist layer subjected to the radiation to undergo a structural change; and removing regions of the photoresist layer, wherein the removed regions comprise the regions that underwent a structural change or the regions that did not undergo a structural change, such that the remaining regions of the photoresist layer define the trench;

disposing a paste within the trench, wherein the paste comprises magnetic powder and a hardenable carrier;

magnetizing the magnetic powder; and leaving the remaining regions of photoresist in place.

2. The method of claim 1 wherein the photoresist layer is a negative acting photoresist.

\* \* \* \* \*